(12) United States Patent
Nordquist et al.

(10) Patent No.: US 10,984,976 B1
(45) Date of Patent: Apr. 20, 2021

(54) MICROFABRICATED ION TRAP CHIP WITH AN INTEGRATED MICROWAVE ANTENNA

(71) Applicant: National Technology & Engineering Solutions of Sandia, LLC, Albuquerque, NM (US)

(72) Inventors: Christopher Nordquist, Albuquerque, NM (US); Matthew G. Blain, Albuquerque, NM (US); Peter Lukas Wilhelm Maunz, Albuquerque, NM (US); Christopher W. Berry, Mountain View, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/995,987

(22) Filed: Aug. 18, 2020

Related U.S. Application Data

(60) Provisional application No. 62/895,684, filed on Sep. 4, 2019.

(51) Int. Cl.
*H01J 3/00* (2006.01)
*H01L 49/00* (2006.01)

(52) U.S. Cl.
CPC .............. *H01J 3/00* (2013.01); *H01L 49/006* (2013.01)

(58) Field of Classification Search
CPC ................................. H01J 3/00; H01L 49/006
See application file for complete search history.

(56) References Cited

U.S. PATENT DOCUMENTS

| | | | |
|---|---|---|---|
| 6,893,578 B1 | 5/2005 | Clews | |
| 7,098,449 B1* | 8/2006 | Miller | G01N 27/624 250/281 |
| 10,418,443 B1* | 9/2019 | Nordquist | B82Y 10/00 |
| 2005/0061767 A1* | 3/2005 | Pai | H01J 49/424 216/2 |
| 2016/0322188 A1* | 11/2016 | Youngner | G06N 10/00 |

OTHER PUBLICATIONS

Baker, R. Jacob, CMOS Circuit Design, Layout, and Simulation, Revised Third Edition, John Wiley & Sons (2008), vol. 1, Chapter 7, "CMOS Fabrication by Jeff Jessing," pp. 161-212, particularly at pp. 206-211.

(Continued)

*Primary Examiner* — Brooke Purinton
(74) *Attorney, Agent, or Firm* — Martin I. Finston

(57) ABSTRACT

An ion trap chip, which may be used for quantum information processing and the like, includes an integrated microwave antenna. The antenna is formed as a radiator connected by one of its ends to the center trace of a microwave transmission line and connected by its other end to a current return path through a ground trace of the microwave transmission line. The radiator includes several parallel, coplanar radiator traces connected in series. The radiator traces are connected such that they all carry electric current in the same direction, so that collectively, they simulate a single, unidirectionally flowing sheet of current. In embodiments, induced currents in underlying metallization planes are suppressed by parallel slots that extend in a direction perpendicular to the radiator traces.

5 Claims, 9 Drawing Sheets

(56) References Cited

OTHER PUBLICATIONS

Biedermann, G. et al., "Sandia Ion Trap Foundry", SAND20100327, 2010, Sandia National Laboratories.
Blain, Matthew and Stick, Daniel, "Surface Electrode—Triangle—Ion Trap Technology Overview", SAND20138542. 2013, Sandia National Laboratories.
Blatt, Rainer and Wineland, David, "Entangled States of Trapped Atomic Ions", Nature, 2008, pp. 1008-1015, vol. 453.
Chiaverini, J. et al., "Surface-Electrode Architecture for Ion-Trapped Quantum Information Processing", Quantum Information and Computation, 2005, pp. 419-439, vol. 5.
De Paolis, R. et al., "Low-Loss DC-100 GHz Suspended Microstrip Lines on Micromachined SiGe BiCMOS BEOL Technology", IEEE Microwave and Wireless Components Letters, 2016, pp. 225-227, vol. 26.
Haffner, H. et al., "Quantum computing with trapped ions", Physics Reports, 2008.
Hettak, K. et al., "Design and Characterization of Elevated CPW and Thin Film Microstrip Structures for Millimeter-Wave Applications", IEEE European Microwave Conference, 2005, 10.1109/EUMC.2005.1610067.
Highstrete, C. et al., "Technology for On-Chip Qubit Control with Microfabricated Surface Ion Traps", SAND2013-9513, 2013, Sandia National Laboratories.
Kwon, Y. et al., "Low-Loss Micromachined Inverted Overlay CPW Lines with Wide Impedance Ranges and Inherent Airbridge Connection Capability", IEEE Microwave and Wireless Components Letters, 2001, pp. 59-61, vol. 11.
Lee, H-S. et al., "New Micromachined Microstriped Transmission Lines for Application in Millimeter-Wave Circuits", Microwave and Optical Technology Letters, 2004, pp. 6-9, vol. 40.
Leibfried, D. et al., "Quantum dynamics of single trapped ions", Reviews of Modern Physics, 2003, pp. 281-325, vol. 75.
Maunz, P. et al., "Microfabricated traps for Logical Qubits", SAND2017-9902C, 2017, Sandia National Laboratories.
Maunz, P. et al., "Microfabricated traps for Logical Qubits", SAND2018-6697PE, 2018, Sandia National Laboratories.
Milanovick, V. et al., "Micromachined Microwave Transmission Lines in CMOS Technology", IEEE Transactions on Microwave Theory and Techniques, 1997, pp. 630-635, vol. 45.
Moehring, D. et al., "Design, Fabrication, and Experimental Demonstration of Junction Surface Ion Traps", 2011.
Mount, E. et al., "Single qubit manipulation in a microfabricated surface electrode ion trap", SAND2013-4454J, 2013, Sandia National Laboratories.
Nordquist, C. et al., "Poly-Silicon Based Latching RF MEMS Switch", IEEE Microwave and Wireless Components Letters, 2009, pp. 380-382, vol. 19.
Prestage, J. et al., "New ion trap for frequency standard applications", Journal of Applied Physics, 1989, 1013, vol. 66.
Reinke, J. et al., "A 4-Bit RF MEMS Phase Shifter Monolithically Integrated With Conventional CMOS", IEEE MEMS 2011, Cancun, Mexico, pp. 748-751.
Seidelin, S. et al., "Microfabricated Surface-Electrode Ion Trap for Scalable Quantum Information Processing", Physical Review Letters, 2006, 253003, vol. 96.
Sterner, M. et al., "Electrochemically Assisted Maskless Selective Removal of Metal Layers for Three-Dimensional Micromachined SOI RF MEMS Transmission Lines and Devices", Journal of Microelectromechanical Systems, 2011, pp. 899-908, vol. 20.
Stick, D. et al., "Demonstration of a microfabricated surface electrode ion trap", 2010, arXiv:1008.0990v2 [physics.ins-det].
Tabanov, Boyan, "Loading an Equidistant Ion Chain in a Ring Shaped Surface Trap and Anomalous Heating Studies with a High Optical Access Trap", Dissertation, 2015, University of New Mexico.

* cited by examiner

MICROFABRICATED ION TRAP CHIP WITH AN INTEGRATED MICROWAVE ANTENNA

CROSS-REFERENCE TO RELATED APPLICATIONS

The subject matter of this application is related to the subject matter of commonly owned U.S. patent application Ser. No. 15/424,158, filed on Feb. 3, 2017 by C. Nordquist et al. under the title, "Ion Trapping for Quantum Information Processing", the entirety of which is hereby incorporated herein by reference.

This application claims priority to U.S. Provisional Application No. 62/895,684, filed on Sep. 4, 2019 and titled "Microfabricated Ion Trap Chip with an Integrated Microwave Antenna," the entirety of which is hereby incorporated herein by reference.

ACKNOWLEDGEMENT OF GOVERNMENT SUPPORT

This invention was made with Government support under Contract No. DE-NA0003525 awarded by the United States Department of Energy/National Nuclear Security Administration. The Government has certain rights in the invention.

FIELD OF THE INVENTION

The invention relates to ion traps for quantum information processing.

ART BACKGROUND

It has long been known that isolated atomic ions can be confined in so-called "ion traps" constituted by superposed electrostatic and radio frequency (RF) fields. The technology of ion traps was first developed for applications in mass spectrometry. More recently, however, researchers in the field of quantum information processing have recognized that an ensemble of trapped atomic ions is a promising host system for the operations that underlie quantum computation. Atomic energy levels can be used to encode quantum bits (qubits) in trapped ions and optical, RF, or microwave energy can be used realize quantum gates between these qubits. Coherence times that are ample for quantum computation have been demonstrated. Techniques have been developed for storing and transporting pluralities of trapped ions.

It has been known since the publication of Earnshaw's theorem in 1842 that a charged particle cannot be stably trapped solely with electrostatic fields. Instead, ion traps rely at least in part on the ponderomotive force exerted on ions by an oscillatory (ac) field, typically at radio frequency. The ponderomotive force can be understood intuitively as the time-averaged effect on the position of an ion driven by a spatially inhomogeneous, oscillating electric field. Within each cycle of the oscillating field, the ion will be displaced farther during the half-cycle when the field is stronger at the ion's initial position. The net effect is to urge the ion in the direction of decreasing field strength, irrespective of the polarity of the ionic charge.

Quantitatively, a pseudopotential $\psi(x)$ is defined in terms of the charge q and mass m of the ion and the angular frequency $\Omega$ and electric field strength $E(x)$ of the RF field by:

$$\psi(x) = \frac{q}{4m\Omega^2} E^2(x).$$

The ponderomotive force $F_p(x)$ is proportional to the gradient of the pseudopotential; that is, $$F_p(x) = -q\nabla\psi(x).$$

The trap center is at the null of the ac electric field, which leads to the minimum of the RF pseudopotential. The trapped ions oscillate about this RF null. These oscillations are referred to as secular motion, with secular frequencies $\omega_i$. Under the assumption of small-amplitude harmonic motion about the RF null, and assuming that the magnitude of the electric field varies as $1/r$, where r is the distance from the potential minimum, the secular frequencies are approximated by $$\omega_i = \frac{q}{2m\Omega}\sqrt{\partial_i^2 E^2(x)}.$$

It will be understood from the above equation that the secular frequencies are determined by the curvature of the pseudopotential.

In stable traps, the secular frequencies are smaller than the RF frequency $\Omega$. A stability factor $q_s$ is defined by $q_s = 2\sqrt{2}(\omega_i/\Omega)$. Stability of ions in the trap is described by the stability diagram for Mathieu's differential equation. For $q_s < 0.9$ and small control voltages, traps are stable.

Ion traps that rely on an RF null in the pseudopotential are often referred to as Paul traps, in recognition of the pioneering work of Wolfgang Paul in the 1950s. The trap that Paul demonstrated in 1954 used a quadrupole RF field produced by a ring electrode describing a hyperboloid of revolution about a central axis, and two hyperbolic end-cap electrodes situated at opposite positions along the central axis.

Geometrically, the hyperbolic Paul trap is a bulk three-dimensional (3D) trap. The RF null is point-like, which limits the trap occupancy with minimal micro-motion at any given time to a single particle.

The principles mentioned above are discussed more fully in D. Leibfried, R. Blatt, C. Monroe, and D. Wineland. "Quantum Dynamics of Single Trapped Ions." *Reviews of Modern Physics* 75, no. 1 (Mar. 10, 2003): 281-324, https://doi.org/10.1103/RevModPhys.75.281.

A further development is the linear 3D trap, which extends the RF null into a nodal line along a central symmetry axis of the device. Four rod-shaped electrodes, arranged in opposing pairs, are arrayed about the central axis. One pair is grounded and the other pair is excited with the RF input signal. Axial confinement is provided by static voltages applied to the endcaps.

The linear 3D trap was first introduced in 1989. (See, for example, J. D. Prestage et al., *J. Appl. Phys.* 66.3 (1989), 1013-1017.) In more recent developments, the three-dimensional conformation of the electrodes has been unfolded and mapped to a two-dimensional (2D) surface to produce a surface RF trap. Unlike the bulk traps, the surface traps permit optical access to the trapped ions over a full hemisphere.

An early design for a surface RF trap was described in J. Chiaverini et al., "Surface-Electrode Architecture for Ion-Trap Quantum Information Processing," *Quantum Info. and Comp.* 5 (2005) 419-439. In that design, there are five coplanar, rectilinear electrodes. The center electrode and the two outer electrodes are maintained at RF ground, and the RF signal is applied to the other two electrodes. The RF null is in a line above and parallel to the center electrode. This line coincides with the z-axis, i.e. the principal axis of the trap in the longitudinal direction. Importantly, the two outer electrodes can be subdivided into segments for independent application of static (dc) potentials that can be varied in the longitudinal direction for purposes of longitudinal confinement and various types of control.

The other two principal axes lie in a plane perpendicular to the z-axis. Because of the mirror symmetry of the five-electrode design, the x- and y-axes are respectively parallel and perpendicular to the electrode plane.

It is noteworthy, however, that the x- and y-axes can be rotated within their plane by changing the relative widths of the respective electrodes in a manner that breaks the mirror symmetry.

Chiaverini et al. predicted that a five-electrode surface RF trap would be able to trap ions at a distance of about 50 μm above the electrode plane. For an input RF signal 100V in amplitude and 100 MHz in frequency, the predicted secular frequencies would be in the range of 10 MHz.

A four-electrode surface RF trap was reported in S. Seidelin et al., "Microfabricated Surface-Electrode Ion Trap for Scalable Quantum Information Processing," *Phys. Rev. Lett.* 96 (2006) 253003-1 to 253003-4. In that design, the two RF electrodes alternated with the two dc control electrodes. One of the control electrodes was subdivided into four independent segments. RF grounds for the control electrodes were provided by 820-pf capacitors.

The z-axis of the Seidelin et al. trap was about 40 μm above the electrode plane. The RF input signal had an amplitude of about 46V to about 103V and a frequency of about 87 MHz. The longitudinal secular frequency was in the range 1.84-2.85 MHz, and the other two measured secular frequencies were in the range 15.78-17.13 MHz for an input RF amplitude of 103.2V, and in the range 5.28-8.29 MHz for an input RF amplitude of 46.1V. The x and y principal axes were inclined at about 45° to the electrode plane.

Subsequent surface RF traps have been made with multiple levels of metallization. Additional levels of metallization are useful for shielding and for routing of voltages and ground connections. For example, D. Stick et al., "Demonstration of a microfabricated surface electrode ion trap," dated Oct. 23, 2018, arXiv:1008.0990v2 [physics.ins-det] (16 Nov. 2010) (four pages), reported a symmetrical four-electrode trap fabricated on an SOI wafer. The electrodes were fabricated in a top metal layer separated by 9-14 μm of insulating oxide from an aluminum ground plane. The dc electrodes were segmented to provide a total of 42 control electrodes. An insulating dielectric separated the ground plane from the top silicon of the wafer. The insulating oxide was formed by deposition into supporting pillars for features of the top metal, including the trap electrodes, their leads, and outside grounded regions.

Exposed dielectrics are liable to collect stray charges that can shift the trapping potentials. To mitigate this problem, trap electrodes and other features of the top metal were made to overhang their supporting oxide pillars by 5 μm. This was intended to reduce line-of-sight exposure of the trapped ions to the dielectric surfaces. The overhang distance was a controllable value achieved by using vertical etch stops around the pillars.

The overhangs had the additional benefit of permitting metal to be vertically deposited over the electrode layer without shorting the electrodes.

Ions were loaded from the backside of the wafer through a hole that extended the entire length of the trapping region.

The trap was operated with RF drive frequencies spanning the range at least from 27 MHz to 43 MHz. The amplitude of the drive signal was in the range 50V-200V. Ions were observed to be trapped 80 μm above the electrode plane. Typical observed secular frequencies were 1 MHz axial and 4 MHz radial. A dc offset applied to the RF electrodes was able to change the radial secular frequencies and to rotate the principal axes. The control electrodes were used to demonstrate repeated shuttling of a trapped ion over half the length of the trapping structure, which encompassed ten electrodes over a distance of 770 μm.

Surface ion traps laid out in two dimensions are necessary for operations in which ion chains are split, recombined, and reordered. Accordingly, junction traps have been designed in which three, or even four, linear traps intersect in a junction region. The junction, however, has been found to cause pseudopotential barriers that may be comparable in height to the trap depth. Loading holes can also cause troublesome pseudopotential barriers. Hence there has been an effort to find design modifications that reduce the pseudopotential barriers arising from both causes.

A surface ion trap with Y-shaped junctions (a so-called "Y-junction trap") was reported in D. L. Moehring et al., "Design, fabrication and experimental demonstration of junction surface ion traps," *New J. Phys.* 13 (2011) 075018 (eight pages). The design of the individual linear traps was similar to that reported in D. Stick et al., cited above. In total, the Y-junction trap had 47 independent dc electrodes.

The RF drive signal had a frequency of about 43 MHz. The rf amplitude was varied from 25V to 165V for trapping in the loading hole, and from 85V to 120V for junction shuttling. The measured height of the trapped ions above the electrode plane (after shuttling from the loading hole) was about 70 μm.

A known technique for locally changing the magnitude and slope of the equilibrium pseudopotential is to spatially modulate the edges of the electrodes. Moehring et al. applied spatial modulation to the dc and RF electrodes near the junction and the loading hole to reduce the pseudopotential barriers caused by those features while maintaining the trapping node within a specified height range above the electrode plane.

More specifically, device performance was predicted from boundary element method (BEM) calculations of the electrostatic field. The electrode geometry for each calculation was specified by a set of parameters defining the electrode shapes in terms of planar polygons in three spatial dimensions. The design was iterated in order to minimize a cost function over the parameter space. The cost function included contributions from the ion height, the pseudopotential values, and the pseudopotential derivatives along the equilibrium trap axis of one arm of the Y-junction.

Experiments performed on fabricated Y-junction traps verified the repeated shuttling of ions in a round trip of about 30 μm that went up and back through each of the three arms of the junction. High degree-of-freedom (DOF) shuttling routines were successfully performed using 25 dc electrodes at a time for linear shuttling and 35 dc electrodes at a time for junction shuttling. Reduced DOF routines were also successfully performed, using the nearest seven dc electrodes at a time in the linear regions and the central 13 dc electrodes in the junction region.

In more complex shuttling routines, three ions were consecutively loaded and independently shuttled into each arm of the junction. Reordering within linear ion chains was demonstrated by splitting the chains, independently shuttling the ions through the junction, and recombining the chains.

A linear surface ion trap can support a chain of trapped ions that are localized at the nodal line and confined within the same potential well. Because there is strong ion-to-ion coupling of the ionic motion in such a trapped chain, the normal modes of the chain form a useful basis of eigenfunctions for describing the collective motion in such a system. Quantum gates between different ions can be realized through operations that affect the collective motion and the internal states of individual ions.

In addition to linear traps, so-called "point-Paul traps" are also of interest for quantum information processing. In a point-Paul trap, the ions are trapped at a nodal point of a three-dimensional quadrupole field. Although in principle such a trap can simultaneously trap multiple ions, micromotion can be minimized for only a single trapped ion. (It will be recalled that "micromotion" is the deterministic motion of the ion at the frequency of the applied RF field.)

If the spacing among multiple point-Paul traps is close enough, the Coulomb repulsion between electrons occupying neighboring traps causes coupling that can be exploited to realize quantum gates.

Although surface ion traps are demonstrably useful, there are still technological challenges to be overcome before these devices can find broad application in quantum information processing.

One challenge is posed when it is desired to use the magnetic component of microwave radiation, instead of laser light, to excite hyperfine qubit transitions in the trapped ions. Current approaches are inefficient because they rely on the far field of an external microwave antenna. Hence, the challenge is to more efficiently couple microwave input signals to the trapped ions for control of the qubit states without encroaching on die area needed to implement the traps.

SUMMARY OF THE INVENTION

The hyperfine states of trapped ions can be manipulated by the magnetic component of a microwave field. For some applications, this provides a desirable alternative to optical manipulation of the quantum states. A microwave field can be delivered to the trapped ions on a die by an integrated microwave antenna. This is efficient in the use of space, and it is also potentially efficient in the use of microwave power.

However, when the microwave antenna is fabricated in an upper metallization layer, the microwave field radiated by the antenna current can induce a current in a lower metallization layer. The induced current flows in the opposite sense to the antenna current. It consequently gives rise to a magnetic field that is opposite in sense to the antenna field. Outside of the volume between the respective layers, the image magnetic field can partially cancel the antenna field. This reduces the magnetic field to which the ions are exposed. In at least some cases, this can make it difficult or impossible to achieve microwave-induced atomic transitions.

We have addressed this problem by designing a microwave antenna that is integrated on the trap chip. The antenna is formed as a radiator connected by one of its ends to the center trace of a microwave transmission line, and connected by its other end to a current return path through a ground trace of the microwave transmission line. The radiator includes several parallel, coplanar traces connected in series. The radiator traces are connected such that they all carry electric current in the same direction, so that collectively, they simulate a single, unidirectionally flowing sheet of current.

At least one ground plane is integrated beneath the radiator. To suppress induced currents, the ground plane is cut through with a plurality of elongated slots that extend in a direction perpendicular to the radiator traces. This feature is meant to reduce long-range flow of induced current that would otherwise partially cancel the desired microwave magnetic field.

In embodiments, at least two ground planes are integrated beneath the radiator, with one ground plane lying above the other. Both ground planes are cut through with elongated slots. The elongated slots in the respective ground planes are offset so that no perpendicular line of sight passes through both a slot of the upper ground plane and a slot of the lower ground plane.

In embodiments, the radiator traces include air bridges that pass over the slots in an underlying ground plane.

In embodiments, the radiator is constituted by five parallel traces, so that the antenna current is reused five times in the radiator.

In embodiments, the microwave antenna current passes from north to south through each of the radiator traces in turn, it being understood that "north" and "south" as used herein are arbitrary designations for the opposing ends of the traces. After passing southward through each trace (except the last), the antenna current traverses a return path that leads it northward on a buried trace formed in a metallization level that lies below the radiator traces.

DETAILED DESCRIPTION

Figure 1:
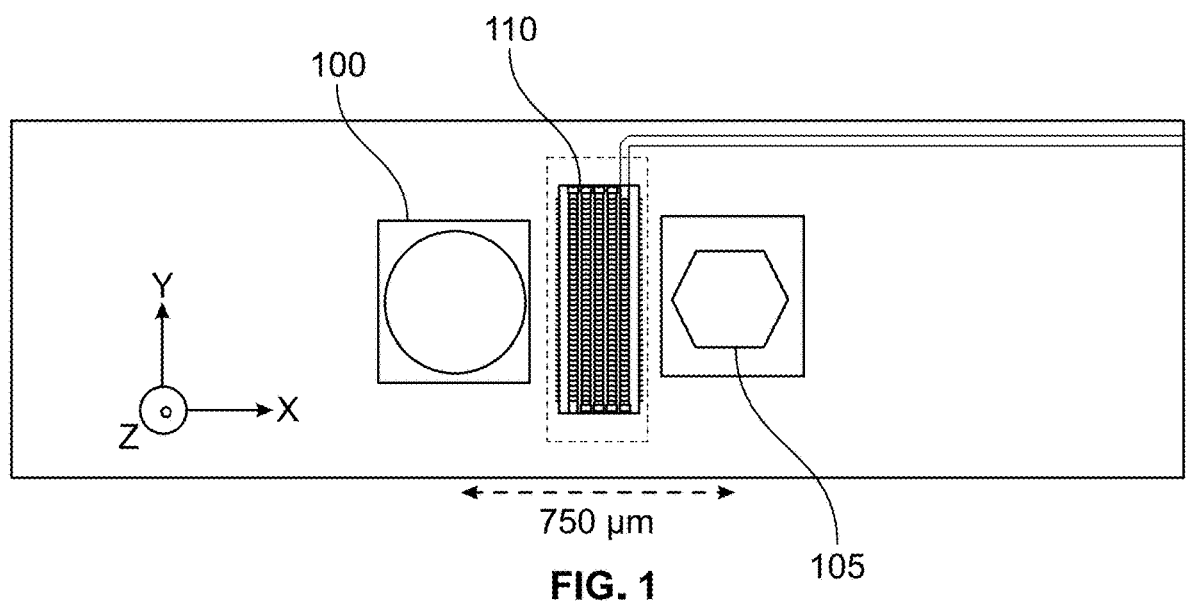
FIG. 1 is a partial plan view of an example ion trap chip. The figure notionally shows two trap structures. A microwave antenna of the kind described here is shown centered between the two trap structures.

Our new microwave antenna is formed on the surface of the ion trap chip. It is designed to provide an out-of-plane microwave magnetic field at the location adjacent to the trap and above the trap surface. The antenna is fabricated using the upper metal layers of the trap structure for the routing of the microwave current.

The metal layers below the antenna include two or more slotted ground planes. These ground planes shield the antenna from the silicon substrate, which would otherwise attenuate the microwave signal. The slots in the ground planes suppress induced currents so that a greater magnetic field can be achieved at the trap than would be realized if a solid ground plane were used. The slots in at least one pair of adjacent ground planes are staggered, i.e., the slots in one plane are offset by, e.g., one-half period relative to the slots in the other plane in order to present the equivalent of a continuous shielding surface.

In embodiments, a useful antenna can be deposited directly onto an intermetal dielectric. However, the antenna in our example embodiment is suspended by air bridges over the slots in the underlying ground plane. This is advantageous because it helps to reduce the parasitic capacitance between the antenna and the ground plane. The air bridges are formed with a wet etch that selectively removes the intermetal dielectric material, for example silicon dioxide. Such an approach is described, for example, in D. Stick (2010), which was cited above.

In an example process to be described below, supporting structures in the intermetal dielectric are protected from the wet etch by vertically deposited tungsten barriers. We refer to these barriers as "etch-stop vias" because we deposit them using a conventional CMOS technology for forming tungsten vias. Chemical-mechanical polishing (CMP) is used in our example process to planarize the intermetal dielectric, and again to planarize the tungsten after it is deposited. Thus, CMP is useful in forming the etch-stop vias and also for effectuating planarity of the fabricated antennas.

In our example embodiment, five parallel side-by-side antenna traces conduct current all in the same direction, which we refer to as "north to south" for convenience only and without loss of generality. In this manner, the five traces collectively simulate a single broad sheet of current. Loopback traces using lower metal layers are used to recycle the current from the south end of each trace and feed it forward onto the north end of the next adjacent trace. Because lower metal layers are used, we refer to these as "buried" loopback traces.

It is of interest in this regard that an earlier implementation of an ion trap with an integrated microwave antenna was described in C. Highstrete et al., "Technology for On-Chip Qubit Control with Microfabricated Surface Ion Traps, SAND2013-9513, Sandia National Laboratories (2013). In that implementation, buried microwave lines were used to feed surface coils that produced the microwave magnetic field. The above-cited patent application Ser. No. 15/424,158 also describes an approach in which microwave lines are buried beneath other metal structures in the trap, and in which the microwave energy is coupled up through slots in the overlying metal layers.

Our new approach differs from these earlier implementations, not least, by placing the microwave traces on the uppermost level and by situating the antenna to the side of the ion-trapping location.

The purpose of the microwave antenna is to generate microwave-frequency magnetic fields that excite hyperfine qubit transitions of the trapped ions. This is an alternative to optical, e.g. laser-based, approaches. The target ion resides in the near-field region of the antenna.

As those skilled in the art will understand, ions of any of various elements can be trapped in ion traps of the kind described here and they can be used as host systems for storing quantum information in the form of qubits. By way of illustration, a microwave antenna with a tuned frequency response in the range 1.2-1.3 GHz is useful for driving the pertinent atomic transitions of beryllium ions.

In an example, the antenna is driven by an off-chip source, with 50Ω impedance, connected through an off-chip matching network.

FIG. 1 is a partial plan view of an example ion trap chip. The figure shows two trap structures 100, 105, with the microwave antenna 110 centered between them. Also shown in the figure is a set of coordinate axes. As shown, the x-axis is the width axis of the antenna, the y-axis is the length axis of the antenna, and the z-axis is perpendicular to the substrate and to the plane of the antenna. As represented in FIG. 1, the positive direction of the z-axis is toward the observer who is looking downward at the top surface of the chip. The x-axis is parallel to the line connecting the centers of the respective trap structures.

In the example of FIG. 1, the traps are 750 µm apart; thus, a trapped ion in either trap will lie 375 µm from the center of the chip and the center of the antenna. The layout for the underlying interconnections and the traps left room for an area of about 300 µm×800 µm for the antenna.

In our example chip, the antenna was oriented so that the in-plane component of the microwave-frequency magnetic field was aligned with the x-axis of the trap. This orientation was dictated, in part, by the geometrical constraints of our design. More generally, the device performance is optimized by maximizing the component of the magnetic field that is parallel to the principal axis of the trapped ions.

The antenna is essentially a shorted microwave transmission line. Shorting the far end of the transmission line produces the maximum amount of current for a given amount of microwave input power. The wavelength at 1.25 GHz is 240 mm in air and about 120 mm in silicon dioxide dielectric. As the antenna is only of millimeter scale or less, wavelength-scale variations in current are negligible along the length of the antenna.

The current at the end of the transmission line can be calculated as a function of delivered power $P_{del}$. For a short-circuited transmission line and a source impedance of $Z_0$, this current is calculated as $2(P_{del}/Z_0)^{0.5}$. Using a resonant matching network can decrease the equivalent source impedance and increase the current at the antenna.

A key challenge of integrated antennas is the presence of conducting layers underneath the transmission line antenna. These conducting layers produce induced currents that flow in the direction opposite to the currents on the trace. Because they are reversed in sign, the induced currents generate magnetic fields that tend to cancel the desired magnetic field outside of the volume between the trace and the underlying metal plane. In particular, these image fields significantly reduce the desired magnetic field in the space above the trace.

By way of example, we simulated a single-trace antenna on top of the interconnect stack over a ground plane. We calculated that the generated magnetic field at the location of the ion (in microtesla per ampere of microwave-frequency electric current) would be less than 20 µT/A. For the same trace without a ground plane, by contrast, the simulation predicted a magnetic field of 300 µT/A.

Our simulations also predicted that at the ion location (i.e., about 300 µm from the microwave trace), the magnetic field of an isolated horizontal trace would be nearly vertical, but with a ground plane, the field would be oriented only 10° from the surface of the substrate. This difference is attributable to attenuation of the vertical field component by the upper ground plane.

However, the reduction in magnetic field due to the presence of a ground plane can be mitigated by slotting the ground plane in the direction perpendicular to the flow of current along the microwave trace. This suppresses the long-range flow of induced current in the ground plane that would otherwise cancel the field of the intended microwave current.

We simulated a design with a slotted ground plane and five parallel microwave antenna traces as shown in FIG. 1. The predicted magnetic field at the trapped ion location was 570 µT/A.

Figure 2:
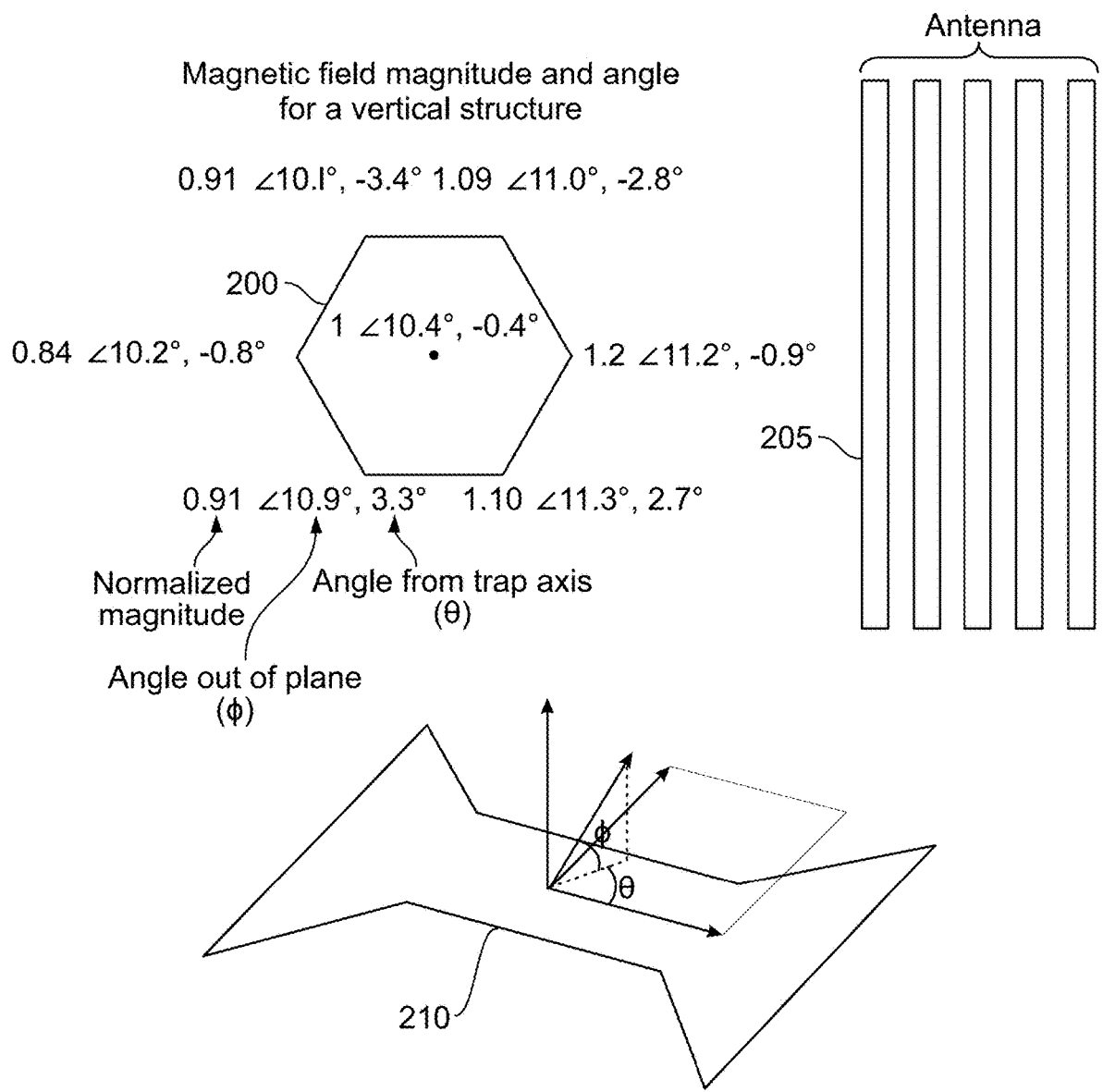
FIG. 2 illustrates numerical modeling results for the magnitude and orientation of the magnetic field vector over the trap location in an ion trap chip such as the ion trap chip of FIG. 1.

We also calculated the magnitude and orientation of the magnetic field vector over the trap location. FIG. 2 shows our results. The field values are normalized to the magnitude of the field at the center of the trap. As seen in the figure, the outline 200 of a hexagonal footprint represents the trap. The figure includes a schematic representation 205 of the antenna structure.

The three numbers shown at the center of the hexagon and at each of its corners are, respectively, the normalized magnitude of the field, the out-of-plane angle $\varphi$ of the field (measured as the elevation above the plane of the trapping structure), and the in-plane azimuthal angle $\theta$ from the trap axis (i.e., from the axis that passes through the centers of both traps, and that corresponds to the x-axis of FIG. 1). Schematic perspective view 210 in the figure illustrates the $\varphi$ and $\theta$.

It will be seen that the magnetic field is oriented at about 10° relative to the surface of the trap. As explained above, this is due to the metal ground plane on top of the die. In our design, there was a limited range for the possible relative orientations of the magnetic field. This range was limited because we needed to leave the ground plane in place to shield it from surfaces that could collect stray charge and expose the trapped ion to the resulting electrostatic fields.

Figure 3:
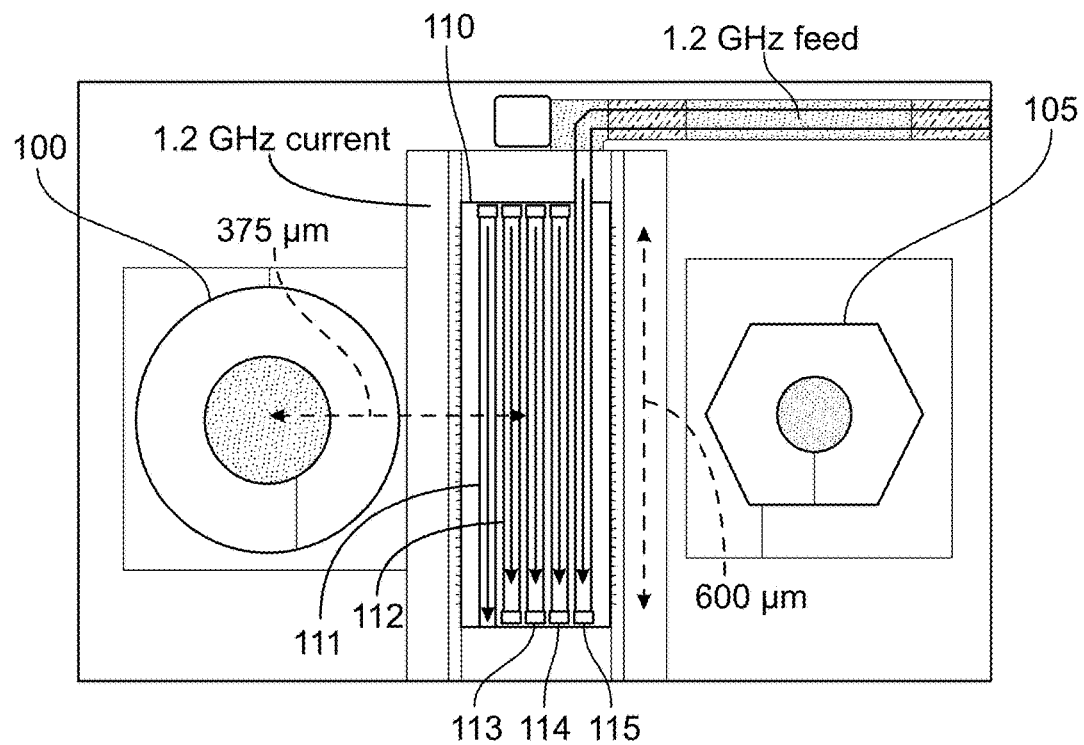
FIG. 3 is a more detailed view of the ion trap chip of FIG. 1.

FIG. 3 repeats the view of FIG. 1 in greater detail. Like elements of the two figures are called out by like reference numerals. What is shown is a partial view of the top metal layer, i.e. the M6 layer, in a six-metal implementation of the example ion trap chip. (In our nomenclature, the six metallization layers are denominated, in sequence starting from the bottom layer, as M1, M2, M3, M4, M5, and M6.) The five parallel microwave traces 111-115 are visible in the figure. These traces are connected in series, so that the microwave current is reused five times in the antenna.

The parallel arrangement of traces mimics a current sheet, but it has lower current crowding, and presents a higher impedance to the driving circuit, than a single broad sheet of current.

Figure 4:
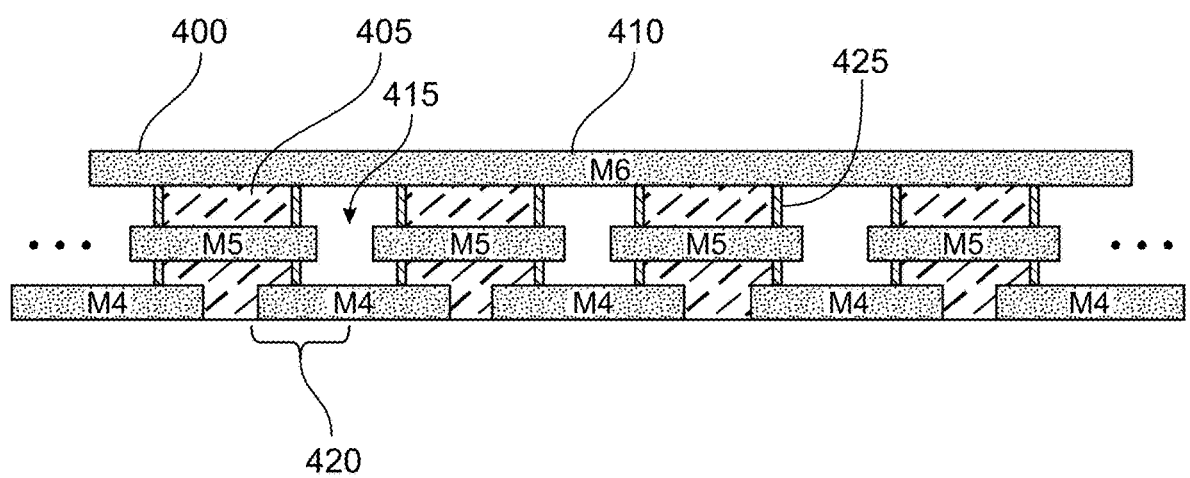
FIG. 4 is a cartoon drawing of a partial cross-section of the microwave antenna of FIG. 3.

FIG. 4 is a cartoon drawing of a partial cross section of the antenna of FIG. 3. Parts of three metallization layers (M4, M5, and M6) are visible in the figure. The view is taken along a line of sight that is parallel to the substrate, perpendicular to the long axis of the microwave traces in M6, and parallel to the slots in M5 (and underlying layers). It will be apparent from the figure that the antenna trace 400 in M6 is supported at intervals by silicon dioxide columns 405, and that between the columns, the antenna trace forms an air bridge 410 over a gap 415 that extends down to M4. It will also be apparent that each slot in M5 overlies a metal strip in M4 with some overlap 420, so that there is no direct line-of-sight from above the antenna to any exposed dielectric.

In the view of FIG. 4, the tungsten etch-stop vias 425 have been left in place. As shown, they are protecting the silicon dioxide columns from the wet etch that will remove undesired intermetal dielectric. The etch-stop vias will subsequently be removed using a selective etchant for tungsten.

Figure 5:
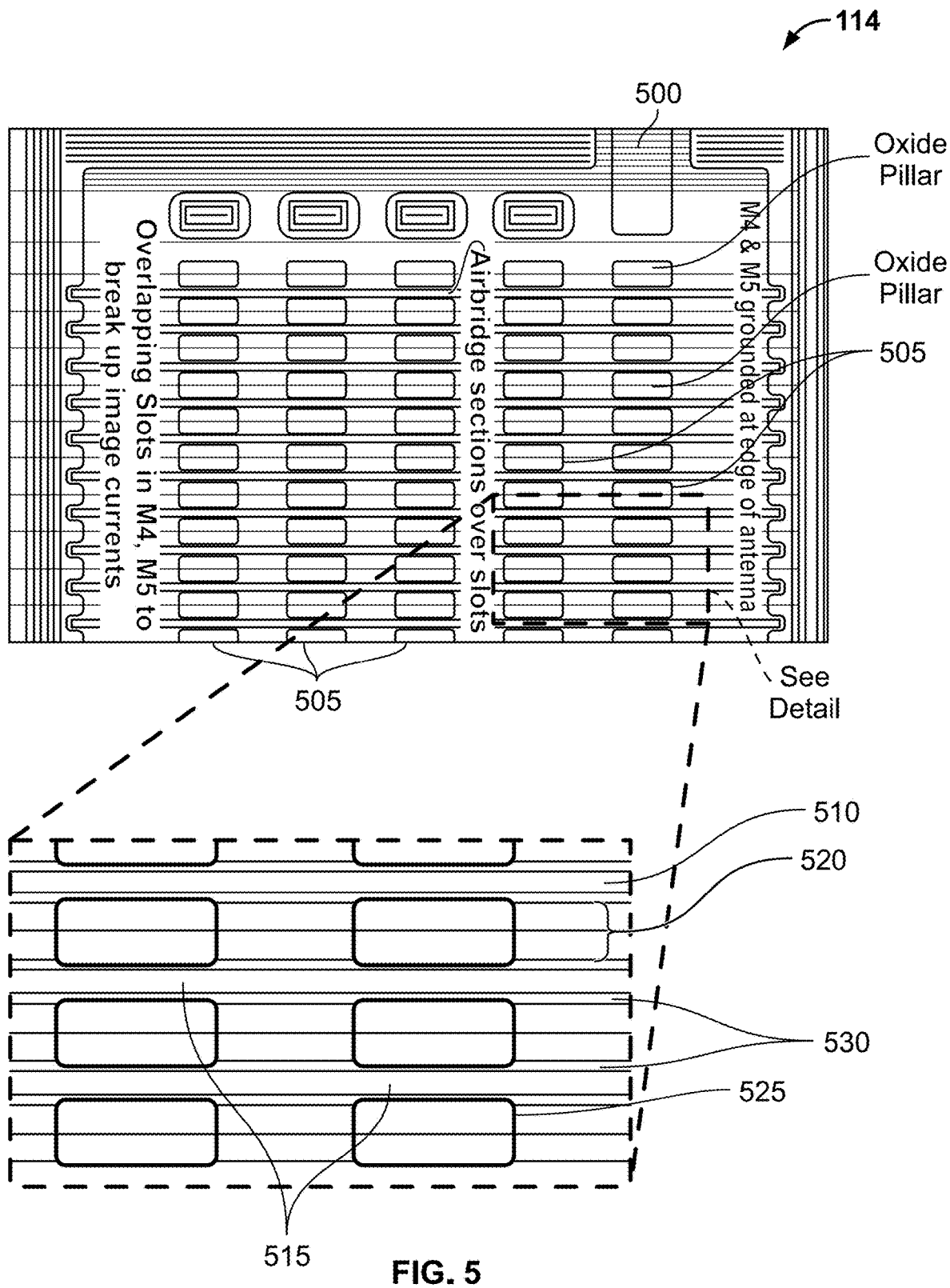
FIG. 5 is a detail of FIG. 3, showing in plan view how the north end of the microwave antenna is laid out.

FIG. 5 is a detail of FIG. 3, showing in plan view how the north end 500 of the antenna is laid out. The five microwave traces 505 on M6 are visible in the figure. The figure also shows the slots 510 in M5. The view of the microwave traces includes the airbridge sections 515 over the slots in M5. The figure also shows the metal strips 520 in the M5 ground plane, the etch-stop vias 525 between M5 and M6 that protect the oxide pillars (i.e., the pillars that support the antenna traces), and the etch-stop vias 530 between M4 and M5.

The microwave current is introduced to the north end 500 of the right-most trace, flows to the southern end of the trace, and then is returned to the northern end of the next trace by a buried trace on underlying metal. After the current exits the south end of the second trace, the same process is repeated three more times, so that the current is fed into all five traces. All return paths are routed at the periphery of the layout and beneath a ground shield to avoid magnetic field cancellation.

We performed 3D electromagnetic simulations to calculate the input impedance where the current is introduced to the antenna. Our result was 12+3j Ω at 1.2 GHz frequency. The real part of the antenna impedance is due to the metal losses in the antenna structure; it would vary with metal resistivity, hence also with temperature. The imaginary part of the impedance is due to the inductance and capacitance of the antenna; it would vary with frequency.

The total physical length of the microwave current path is about 6 mm, which corresponds to an electrical length of $\lambda/20$ (18° of phase delay) for the antenna structure. Thus, the current variation along the length of the line due to the standing wave ratio is expected to be less than $1/20$, i.e., less than 5%.

The microwave traces are on M6. The ground planes on all lower metal levels, M1-M5, are cut through with slots oriented perpendicular to the direction of current flow in the five top-level antenna traces. (Thus, in our nomenclature, the slots are oriented in the east-west direction.)

The M4 and M5 slots are staggered by positioning them with an offset that in our example implementation is one-half period. This stagger shields the substrate from the antenna and from the trapped ion, and it blocks the line of sight between the trapped ion and any dielectric surface. In our example implementation, the slots in the lower metallization levels M1, M2, and M3 are in register with the slots in M4.

M4 and M5 are grounded at their edges. Avoiding ground connections in the region beneath the top-level antenna traces helps to suppress undesired induced currents.

As explained above, the top-level antenna traces are formed in M6. These traces are attached to M5 with anchors of silicon dioxide (as the intermetal dielectric), and they airbridge across the slots in M5. All of the silicon dioxide is removed from the exposed surfaces of M5 (i.e., the surfaces not directly underneath the M6 traces) and from the slot openings in M5 that overlie M4.

Figure 6:
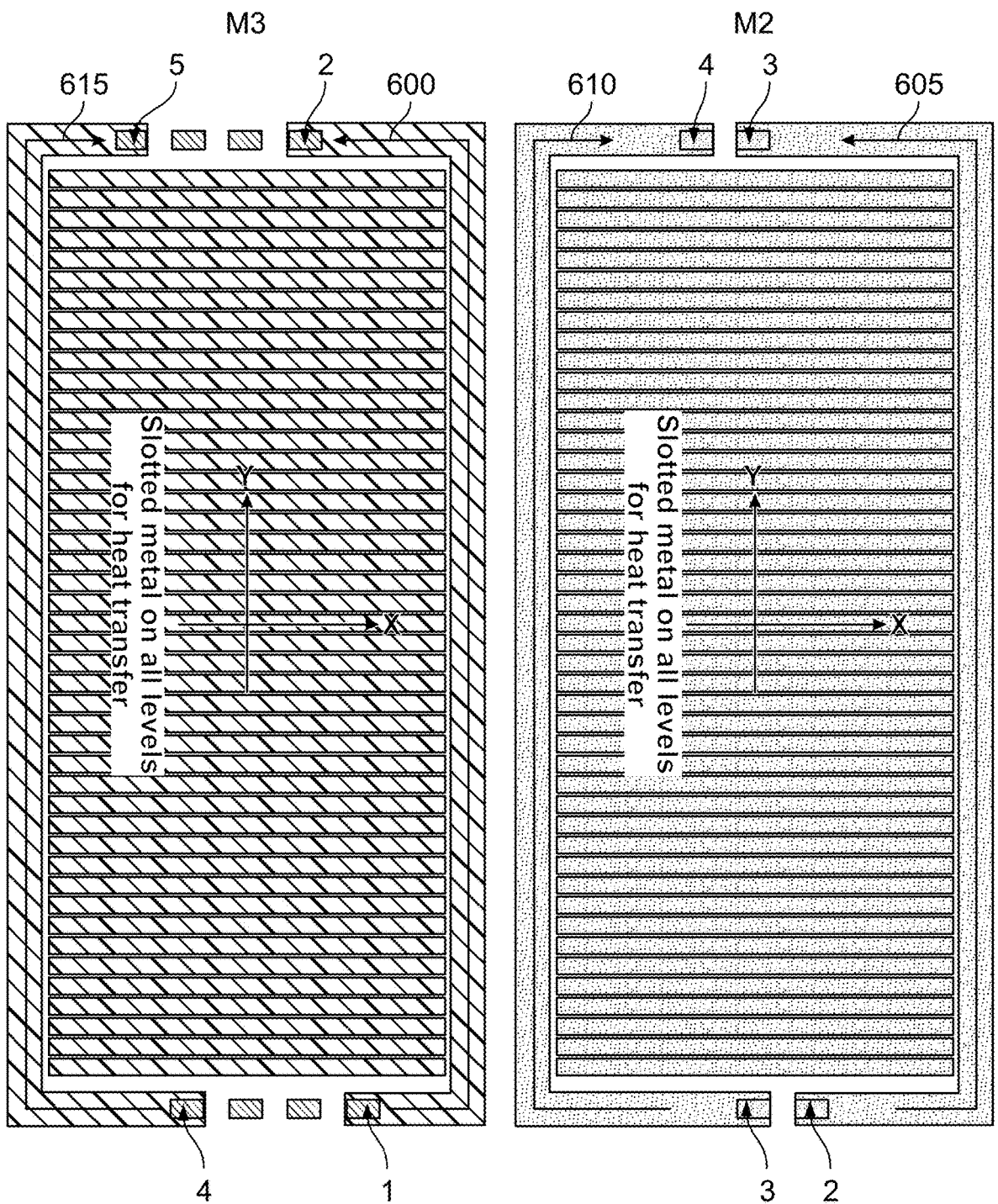
FIG. 6 is a plan view showing details of intermediate metallization layers in an implementation of an example ion trap chip.

FIG. 6 shows details of the underlying M3 and M2 layers. The pattern of slots on M4 is replicated on M3 and M2, as well as on M1. The lower metals M3 and M2, as well as M1, are connected to M4 with tungsten-filled vias. Among other things, this helps to improve heatsinking of the antenna structure to the substrate.

In M3 and M2, the south-to-north in-plane return paths for the microwave antenna current are routed along the outer edge of the antenna; they are obscured from the upper surface of the trap by ground planes on M4-M6. The magnetic field generated by these buried return traces is shielded from the region above the trap by the upper metal layers, so that the resulting magnetic field in the region above the antenna is predominantly generated by the currents that all flow in the same north-to-south direction along the upper traces.

Turning again to FIG. 6, it will be seen that:

the return path 600 from antenna trace 1 is routed along the right-hand side of M3 (as viewed in the figure) and then passed vertically to the north end of trace 2;

the return path 605 from trace 2 is routed along the right-hand side of M2 and then passed vertically to the north end of trace 3;

the return path 610 from trace 3 is routed along the left-hand side of M2 and then passed vertically to trace 4; and the return path 615 from trace 4 is routed along the left-hand side of M3 and then passed vertically to trace 5.

Figure 7:
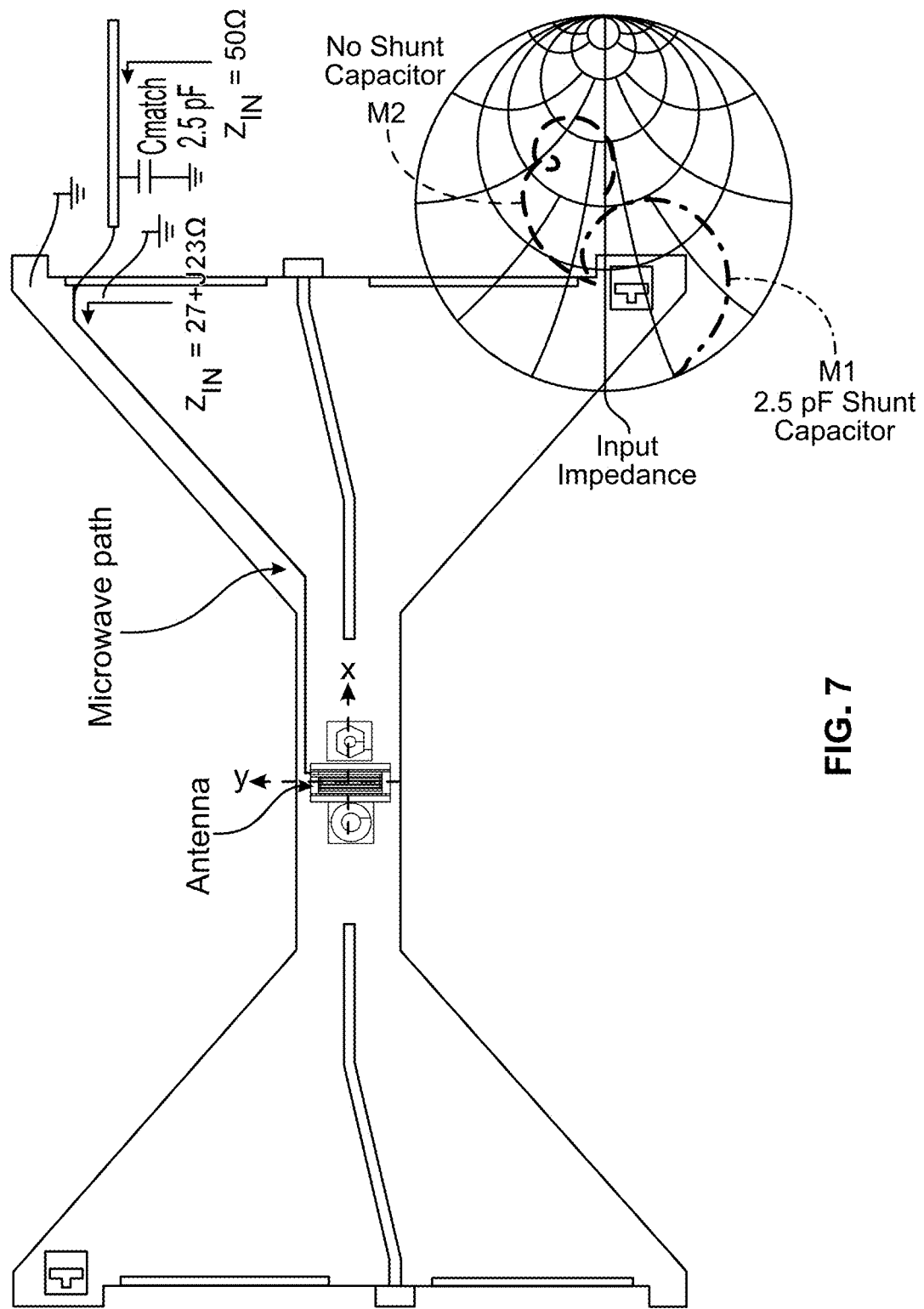
FIG. 7 is a simplified layout, in plan view, of an entire trap chip.

FIG. 7 provides a simplified layout of the entire trap chip, including the routing of the microwave signal from the edge of the die to the antenna. As shown in the figure, a grounded coplanar waveguide (GCPW) transmission line delivers the microwave signal to the antenna. The GCPW line runs from a bond pad at the upper right corner of the die to the antenna, as shown.

The coplanar waveguide is constituted by a trace in the uppermost metal (M6) layer over a ground plane defined in M1. M6 is attached to M1 by slot vias that are situated along the edges of the ground plane and that pass through all of the intervening metal layers.

An example GCPW line has a 20-μm-wide center trace and 5-μm gap between the trace and ground. Those dimensions are calculated to yield a 50Ω line with 0.2 dB/mm of loss at room temperature (for a frequency of 1.2 GHz) and an electrical length of 15°.

Figure 8:
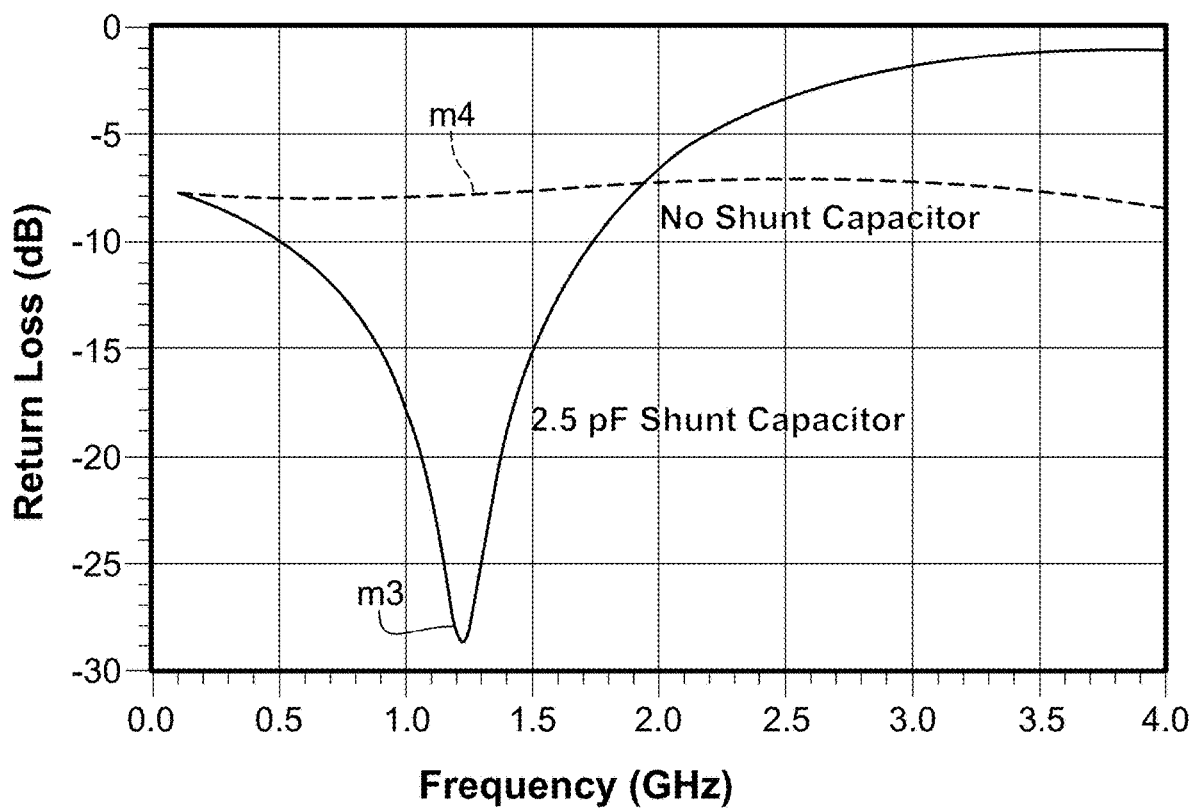
FIG. 8 is a plot of numerically modeled loss for a microwave antenna of the kind described here.

From electromagnetic modeling combined with circuit models, we estimated the room-temperature input impedance of the antenna to be 27+23j Ω at 1.2 GHz. Without any additional impedance matching, the return loss of the antenna at the chip input is estimated to be 7 dB due to the high resistance of the structure at room temperature. With a simple shunt matching network, however, the return loss is improved to 30 dB. Loss calculations are plotted in FIG. 8.

Flexibility in the design of the off-chip matching network is desirable because the antenna impedance will be sensitive to temperature, and because it might also be sensitive to subtle manufacturing variations in the properties of the ion trap die.

Figure 9:
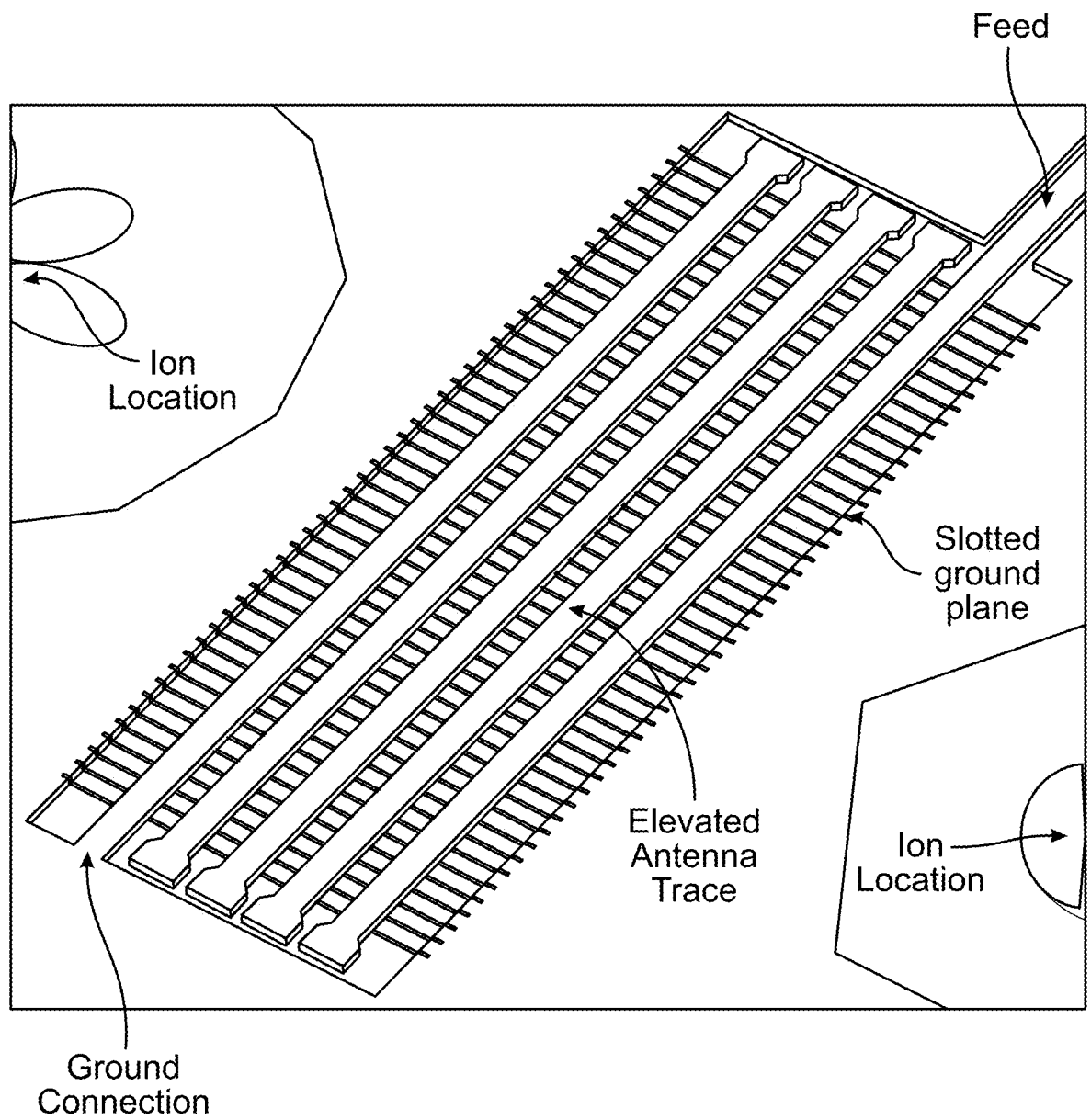
FIGS. 9 and 10 are perspective views of an example microwave antenna of the kind described here.

FIG. 9 is a perspective view, based on a scanning electron micrograph, of the completed microwave antenna. Portions of the two trap structures are also visible in the figure. The suspension of the five M6 antenna traces over M5 is visible in the figure.

Figure 10:
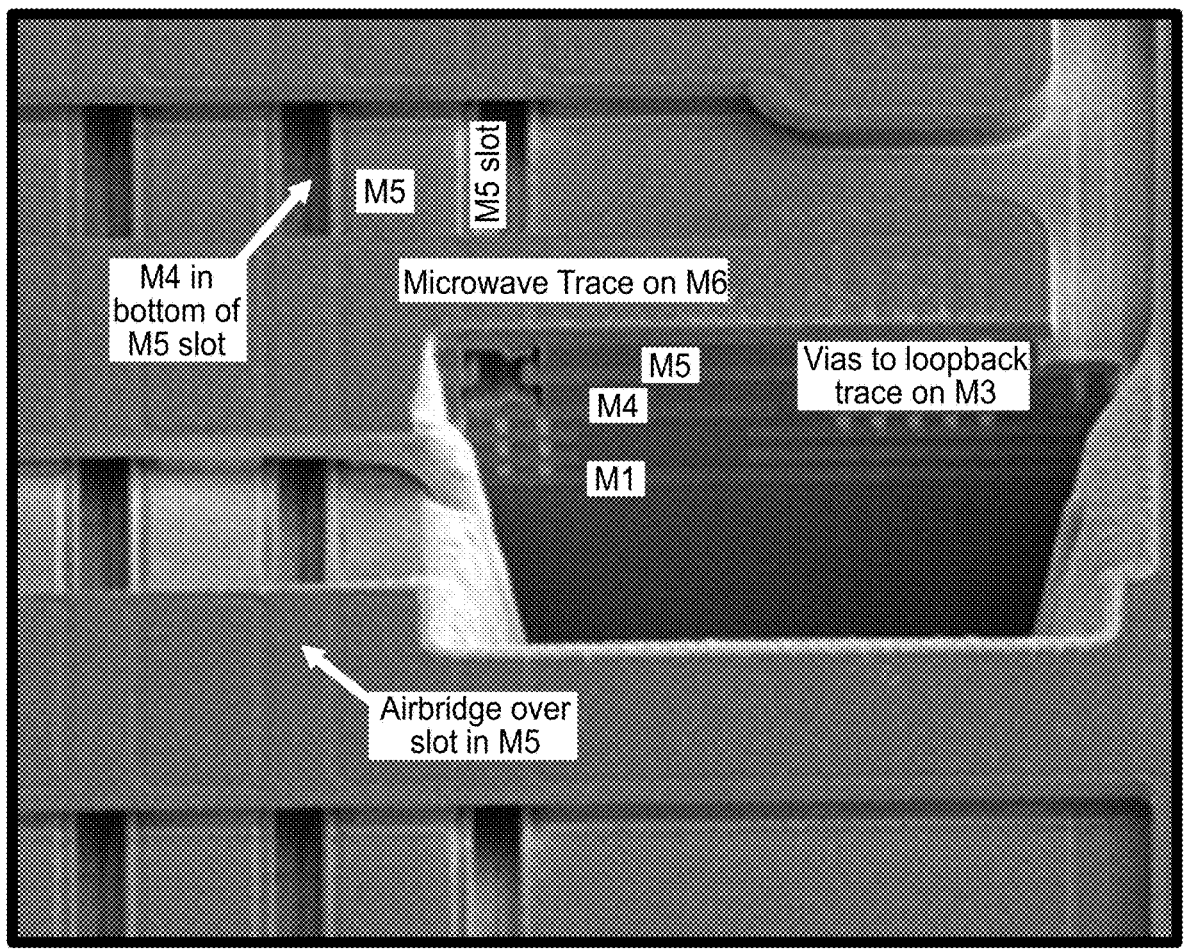

FIG. 10 is a perspective view looking down onto the top of the antenna from a slight angle. The figure is based on a focused ion-beam scanning electron micrograph. Portions of three antenna traces are visible in the figure. Three slots in M5 can be seen, together with M6 airbridges over those slots. Portions of M4 can be seen through the M5 slots, where the silicon dioxide dielectric has been removed. Vias connecting an M6 microwave trace to a loopback trace on M3 can also be seen in the figure.

Process Description

Our example device was made using techniques of deposition, patterning, and etching that are known from back-end-of-line (BEOL) CMOS fabrication technology. A useful reference in this regard is R. Jacob Baker, *CMOS Circuit Design, Layout, and Simulation*, Revised Third Edition, John Wiley & Sons (2008), Volume 1, Chapter 7, "CMOS Fabrication by Jeff Jessing," pp. 161-212, particularly at pages 206-211.

Another useful reference is U.S. Pat. No. 6,893,578, issued to P. J. Clews et al. on May 17, 2005 under the title, "Selective Etchant for Oxide Sacrificial Material in Semiconductor Device Fabrication," which is commonly owned herewith, and which is hereby incorporated herein in its entirety.

U.S. Pat. No. 6,893,578 describes a method of wet etching for semiconductor device fabrication that is useful in the present context. As described there, oxide sacrificial material is removed using an etching solution comprising a mixture of hydrofluoric acid (HF) and sulfuric acid ($H_2SO_4$). The hydrofluoric acid concentration according to the above-cited patent is generally in the range of 40-50% by weight HF, and the sulfuric acid concentration is generally at least 90% by weight $H_2SO_4$.

The hydrofluoric acid and sulfuric acid in the etching solution can be provided in a ratio HF:HSO that ranges from 1:3 to 3:1 or more, and preferably in the range of 1:1 to 3:1. These ratios in the range of 1:3 to 3:1 provide an etch selectivity greater than 100 for the oxide sacrificial material relative to a metal layer that comprises aluminum, such as an aluminum-5% copper metal layer. Etching can be performed with the etching solution at a temperature anywhere in the range of 5°-70° C.

The principle of selective etching to create dielectric support pillars is described, for example, in D. Stick (2010), which was cited above.

In our example implementation, the intermetallic dielectric layers were grown on a silicon wafer in multiple stages of plasma-enhanced chemical vapor deposition (PECVD) of silicon dioxide. The six metallization layers M1-M6 were vapor-deposited aluminum-5% copper. The electrical vias and the etch-stop vias were vapor-deposited tungsten.

Each level of intermetal dielectric was polished flat by CMP prior to the tungsten deposition, and then subjected to a tungsten CMP after the vias were deposited.

The support pillars for the M6 microwave antenna traces were defined by annular tungsten etch-stop vias. Vertical return paths were provided for antenna current to pass between layers at the periphery of the antenna, as described above. These return paths passed through tungsten vias embedded within oxide support columns situated at the northern and southern edges of the antenna. Thus, each of these peripheral support columns was protected by an annular tungsten etch-stop via (which was subsequently removed), and also contained a tungsten electrical via that remained in place.

We found that it was important in this regard to avoid excessive exposure to the HF etchant: If the etch-stop via were breached and the etchant penetrated into the pillar material, the electrical vias could be damaged in the subsequent step of removing the tungsten etch stops.

After forming the metal features on M6, we performed the HF etch to remove all of the sacrificial oxide in a single step. We then removed the tungsten etch stops using a conventional hydrogen peroxide wet etch.

The invention claimed is:

1. Apparatus comprising an ion trap chip, wherein:
    the ion trap chip comprises a substrate, a top metallization layer formed over the substrate, and at least one further metallization layer formed between the substrate and the top metallization layer;
    a microwave antenna is integrated on the ion trap chip;

the microwave antenna comprises a plurality of parallel radiator traces formed in the top metallization layer; and the plurality of radiator traces is connected in series such that the direction of current flow is the same in each radiator trace.

2. The apparatus of claim 1, wherein the series connection between each radiator trace and at least one neighboring radiator trace is made through vertical paths to and from a metallization layer lower than the top metallization layer, and through a horizontal loop-back path in the said lower metallization layer.

3. The apparatus of claim 2, wherein:

the at least one further metallization layer formed between the substrate and the top metallization layer comprises at least a metallization layer nearest the top metallization layer and a metallization layer next-nearest the top metallization layer;

said nearest layer and said next-nearest layer each are fenestrated by a pattern of parallel slots;

the slots are perpendicular to the radiator traces; and the slots in the nearest layer are offset from the slots in the next-nearest layer so that there is no overlap between slots in the respective said nearest and next-nearest layers.

4. The apparatus of claim 3, wherein each of the radiator traces comprises an air bridge over each slot that it crosses in the next-nearest metallization layer.

5. The apparatus of claim 4, wherein a total of six metallization layers are formed over the substrate, said metallization layers respectfully denominated M1, M2, M3, M4, M5, and M6, M6 being the top metallization layer, and wherein:

the radiator traces are formed in M6;

M5 and M4 are respectfully the said nearest and next-nearest metallization layers; and the horizontal loop-back paths are formed in M3 and M2.

* * * * *